United States Patent [19]

Dunn

[11] Patent Number: 5,884,644
[45] Date of Patent: Mar. 23, 1999

[54] QUARTZ TANK FOR WET SEMICONDUCTOR WAFER PROCESSING

[75] Inventor: L. Brian Dunn, Boise, Id.

[73] Assignee: Micron Technology, Inc., Boise, Id.

[21] Appl. No.: 988,109

[22] Filed: Dec. 10, 1997

[51] Int. Cl.$^6$ .................................................. B08B 3/04
[52] U.S. Cl. ...................... 134/186; 134/902; 134/201; 134/198
[58] Field of Search ..................... 134/155, 186, 134/184, 198, 201, 902, 25.4

[56] References Cited

U.S. PATENT DOCUMENTS

| | | | |
|---|---|---|---|
| 3,983,361 | 9/1976 | Wild et al. | 134/902 |
| 4,955,402 | 9/1990 | Miranda | 134/902 |
| 5,148,823 | 9/1992 | Bran | 134/902 |
| 5,279,316 | 1/1994 | Miranda | 134/902 |
| 5,339,843 | 8/1994 | Benedict et al. | 134/186 |
| 5,365,960 | 11/1994 | Bran | 134/184 |
| 5,732,724 | 3/1998 | Becknell | 134/186 |

FOREIGN PATENT DOCUMENTS

| | | | |
|---|---|---|---|
| 59-154028 | 9/1984 | Japan | 134/902 |
| 4-247621 | 9/1992 | Japan | 134/186 |
| 5-152273 | 6/1993 | Japan | 134/902 |

*Primary Examiner*—Frankie L. Stinson
*Attorney, Agent, or Firm*—Trop, Pruner, Hu & Miles, P.C.

[57] ABSTRACT

A quartz tank for wet semiconductor wafer processing includes one or more ports extending through the tank for the exchange of fluids with the tank. The openings may be aligned with a T-shaped quartz stem having an enlarged end retained on the interior side of said quartz tank in sealing abutment therewith. The lower end of the quartz stem may have external threads to abut with a suitable union. The union may include a nut having a reduced diameter lower end to engage an enlarged end of the tubing member connected to the bottom of the quartz stem. An o-ring seal may be sandwiched between the tubing and the lower end of the quartz stem. The nut may be formed of a carbon-fiber reinforced fluorocarbon material such as perfluoroalkoxy.

6 Claims, 1 Drawing Sheet

QUARTZ TANK FOR WET SEMICONDUCTOR WAFER PROCESSING

This invention relates generally to quartz tanks for wet chemical semiconductor processing. Typical wet processing operations would include etching, stripping and cleaning of semiconductor wafers.

BACKGROUND OF THE INVENTION

Wet semiconductor wafer processing is an important part of the overall process of manufacturing semiconductor wafers. Because of the extreme conditions involved in wet wafer processing, the design of wet wafer processing vessels is of critical importance. Wet wafer processing conditions involve highly corrosive chemicals, often at high temperatures.

Normally the tank used to hold the corrosive chemicals is a quartz tank which can resist the corrosive chemical action of wet wafer processing. The tank is normally filled with the active chemical and the wafers are immersed in the tank for processing. Because of the debris which results, it is necessary to withdraw the chemical batch from the tank either for filtration and reprocessing or to permit replacement of the prior chemical batch.

The ports through which the chemicals are withdrawn from the quartz tank are subject to the same severe operating conditions as the quartz tank. Because of the need to connect additional tubing to these ports, the design of these connections is complicated.

Thus, there is a need for fittings for semiconductor wet processing tanks which can withstand the extreme conditions of wet wafer processing while enabling mechanically expeditious techniques for securing the necessary processing lines beneath the tank.

SUMMARY OF THE INVENTION

In accordance with one aspect of the present invention, a quartz tank for holding chemicals for wet semiconductor wafer processing includes a chamber adapted to hold chemicals with a port through the chamber. A quartz stem has an enlarged end retained in the chamber and a tubular portion extending through the port. The tubular portion has external threads. A pipe is connected to the stem, the pipe having an enlarged end. A nut has a first end that engages the enlarged end of the pipe and a second end which is internally threaded to threadedly engage the external thread on the tubular portion.

In accordance with yet another aspect of the present invention, a quartz tank for holding chemicals for semiconductor wafer processing has a chemical chamber with a bottom and sides. A port is formed through the bottom of the chamber. A quartz stem extends through the port. The stem includes an upper enlarged end adapted to engage the bottom of the chamber and a lower tubular end having external screw threads. A length of tubing having an outwardly extending end is abutted against the lower tubular end. An o-ring is retained between the tubing and the lower tubular end. A nut with a first end and an internally threaded end is arranged to connect to the quartz stem. The internally threaded end has a larger diameter than the first end. The first end is abutted against the outwardly extending end of the tubing so as to hold the tubing against the stem. The internally threaded end threads onto the external screw threads on the stem.

In accordance with but another aspect of the present invention, a quartz stem for lining an opening in a quartz tank for semiconductor wafer processing includes a main tubular body made of quartz. An upper end has an enlarged portion extending outwardly from the tubular end so as to sealingly engage the internal surface of the quartz tank around the port.

In accordance with one aspect of the present invention, a fitting for connecting a tubular stem having external screw threads to tubing having an enlarged end in connection with a quartz tank for treating semiconductor wafers includes a tubular polymeric member having a first end turned inwardly to engage an enlarged tubing end. An upper end has internal threads. The polymeric member is made of a carbon fiber reinforced fluorocarbon such as perfluoroalkoxy ("PFA").

DESCRIPTION OF THE PREFERRED EMBODIMENTS

Figure 1:
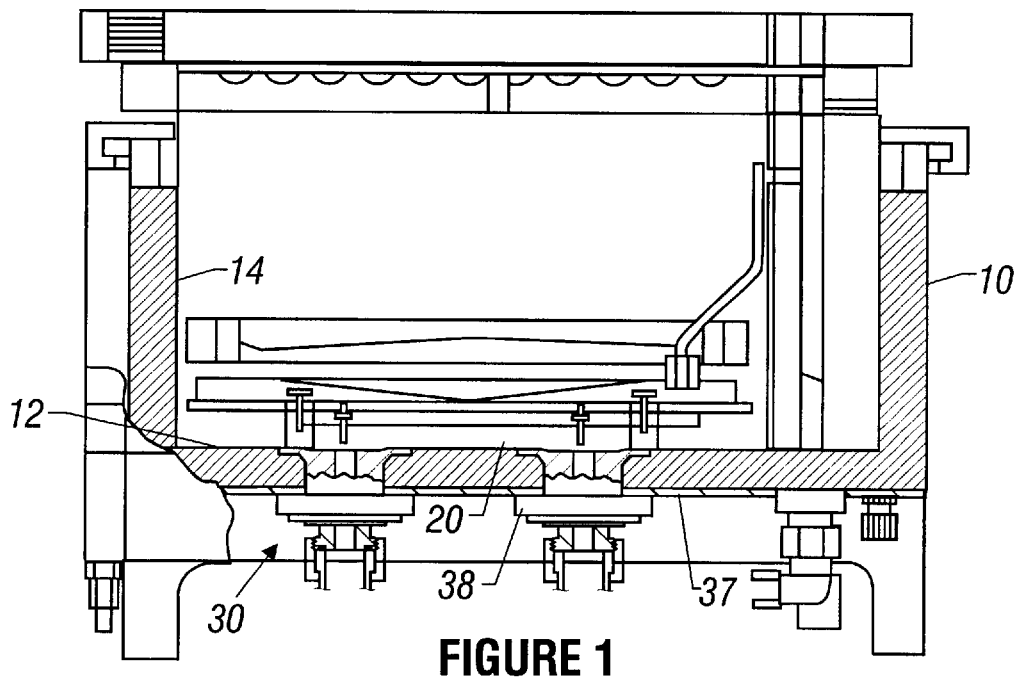
FIG. 1 is a partial cross-sectional view of a quartz tank.

Referring to the drawing wherein like reference characters are used for like parts throughout the several views, a quartz tank 10 for semiconductor processing, shown in FIG. 1, has a bottom 12 and sides 14. While the tank 10 is shown in a simple form, those skilled in the art will appreciate the design, configuration and features of conventional quartz tanks. At least one port 20 is included in the bottom of the quartz tank for allowing chemicals to be withdrawn for reprocessing or to facilitate chemical replenishment.

Figure 2:
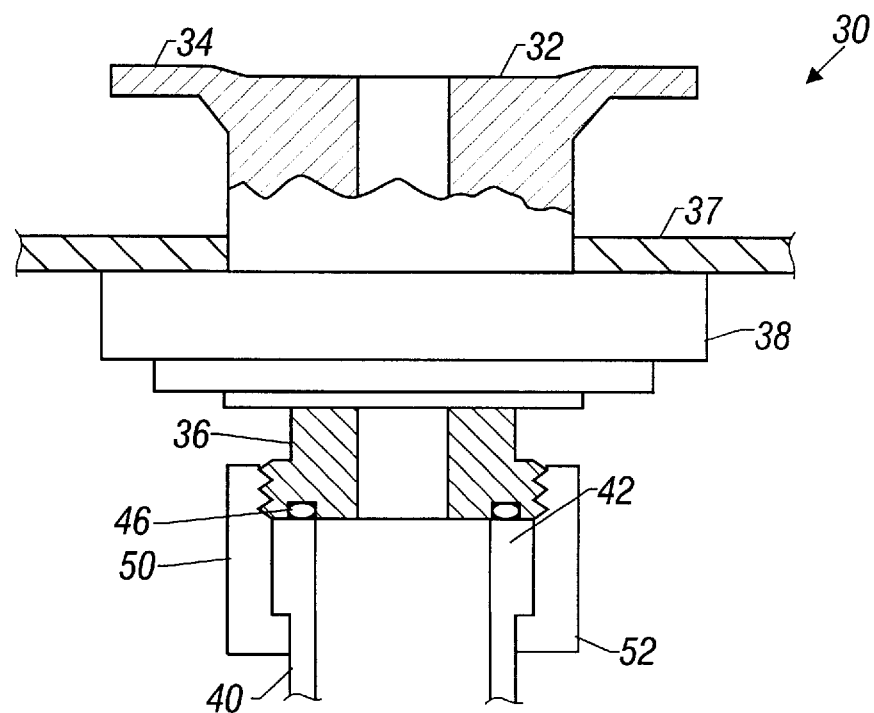
FIG. 2 is an enlarged partial, cross-sectional view of the union shown in FIG. 1.

The port 20 is fitted with a union 30 which includes a T-shaped quartz stem 32 having an enlarged upper end 34 and an externally threaded lower end 36, as shown in FIG. 2. While the enlarged upper end 34 sealingly engages the internal bottom surface 35 of the quartz tank, a retainer 38 engages the lower external surface 37 of the quartz tank 10 to pull the upper end 34 of the quartz stem against the bottom surface 35. The enlarged end of the stem sealingly engages the bottom of the quartz tank.

The quartz stem 32 sealingly abuts with a length of tubing 40 having an enlarged end 42 which engages an O-ring seal 46 retained in an aperture in the stem 32. The seal 46 is retained between the enlarged end 42 of the tubing 40 and the lower end 36 of the quartz stem 32 to prevent leakage between the two parts.

The tubing 40 is brought up against the bottom of the quartz stem 32 by a nut 50 which includes a smaller diameter lower end 52. The end 52 engages the underside of the enlarged end 42 of the tubing 40 and forces the tubing against the lower end 36 of the quartz stem 32. The upper end of the nut 50 is threaded onto the lower threaded end 36 of the quartz stem 32 sufficiently to provide a good seal between the quartz stem 32 and the tubing 40.

In this way a secure connection can be made between the quartz tank and the tubing which minimizes the possibility of leakage. Because the quartz stem is inert to the chemicals utilized, it can withstand constant exposure to extremely corrosive chemicals. A suitable valve may be contained inside the quartz stem to control the flow of fluid from the quartz tank. In addition, a diverter (not shown) may be provided for diverting fluid coming upwardly into the tank and for spreading it uniformly.

The nut 50 is advantageously made of a fluorocarbon such as perfluoroalkoxy ("PFA") with carbon fiber reinforcement.

Suitable carbon fibers include polyacrylonitrite ("PAN") or pitch-based carbon fibers. For example, 10% by weight of carbon fibers may be used. This material resists heat expansion and thereby decreases the likelihood that the nut 50 would come loose from the stem 32 due to heat expansion when exposed to hot chemicals.

While the present invention has been described with respect to a single preferred embodiment, those skilled in the art will appreciate numerous modifications and variations therefrom. It is intended that the appended claims cover all such modifications and variations as fall within the true spirit and scope of the present invention.

What is claimed is:

1. A quartz tank for holding chemicals for a wet semiconductor wafer processing comprising:
    a chamber adapted to hold chemicals;
    a port through said chamber;
    a quartz stem having an enlarged end retained in said chamber and a tubular portion extending through said port, said tubular portion having external threads;
    a pipe connected to said stem, said pipe having an enlarged end; and
    a nut having a first end that engages said enlarged end of said pipe and a second end that is internally threaded to threadedly engage said external threads on said tubular portion.

2. The tank of claim 1 wherein said nut is formed of fluorocarbon.

3. The tank of claim 2 wherein said nut is formed of carbon fiber reinforced perfluoroalkoxy.

4. The tank of claim 1 including an o-ring secured between said quartz stem and said pipe, said o-ring secured in compression.

5. A quartz tank for holding chemicals for semiconductor wafer processing comprising:
    a chemical chamber having a bottom and sides;
    a port through the bottom of said chamber;
    a quartz stem extending through said port, said stem including an upper enlarged end adapted to engage the bottom of said chamber and a lower tubular end having external screw threads;
    a length of tubing having an outwardly extending end, abutted against said lower tubular end;
    an o-ring retained between said tubing and said lower tubular end; and
    a nut having a first end and an internally threaded end, said internally threaded end having a larger diameter than said first end, said first end abutted against said outwardly extending end of said tubing so as to hold said tubing against said stem, said internally threaded end threaded onto said external screw threads on said stem.

6. The tank of claim 5 wherein said nut is formed of carbon fiber reinforced perfluoroalkoxy.

* * * * *